United States Patent
Harris et al.

(10) Patent No.: US 6,968,287 B2
(45) Date of Patent: Nov. 22, 2005

(54) SYSTEM AND METHOD FOR PREDICTING BURN-IN CONDITIONS

(75) Inventors: George E. Harris, Garland, TX (US); Randy L. Brown, II, Allen, TX (US)

(73) Assignee: Texas Instrustments Incorporated, Dallas, TX (US)

( * ) Notice: Subject to any disclaimer, the term of this patent is extended or adjusted under 35 U.S.C. 154(b) by 49 days.

(21) Appl. No.: 10/816,246

(22) Filed: Apr. 1, 2004

(65) Prior Publication Data

US 2005/0222800 A1  Oct. 6, 2005

(51) Int. Cl.$^7$ .............................................. G01K 7/00
(52) U.S. Cl. ...................................... 702/130; 438/14
(58) Field of Search ............................ 324/71.5, 719, 324/760; 438/14, 17; 702/31, 57, 64, 65, 702/81, 83, 84, 127, 130, 179, 181, 182, 702/189; 716/4

(56) References Cited

U.S. PATENT DOCUMENTS

| | | | |
|---|---|---|---|
| 6,175,812 B1 * | 1/2001 | Boyington et al. | 702/118 |
| 6,215,324 B1 * | 4/2001 | Yoshida | 324/760 |
| 6,326,800 B1 * | 12/2001 | Kirihata | 324/760 |
| 6,377,897 B1 * | 4/2002 | Boyington et al. | 702/81 |

OTHER PUBLICATIONS

Vollertsen, P;"BURN-IN"; IEEE International Integrated Reliability Workshop Final Report; Oct. 18-21, 1999; pp 167-173.*

P. Tadayon, "*Thermal Challenges During Microprocessing Testing,*" Intel Technology Journal, Q3, 2000, (8 pages).

* cited by examiner

*Primary Examiner*—Bryan Bui
*Assistant Examiner*—Douglas N Washburn
(74) *Attorney, Agent, or Firm*—Alan K. Stewart; W. James Brady, III; Frederick J. Telecky, Jr.

(57) ABSTRACT

According to one embodiment of the invention, a method for predicting burn-in conditions includes identifying a baseline IDDQ, a baseline temperature, and a baseline IDDQ current density based on a plurality of existing burn-in data for one or more existing devices, determining a theoretical IDDQ current density for a device, determining a ratio of the theoretical IDDQ current density to the baseline IDDQ current density, determining a theoretical process metric for the device at the baseline temperature based on the ratio and the baseline IDDQ, measuring a process metric for an actual device, comparing the process metric for the actual device and the theoretical process metric for the device, and determining an actual burn-in temperature for the actual device based on the comparison.

20 Claims, 1 Drawing Sheet

SYSTEM AND METHOD FOR PREDICTING BURN-IN CONDITIONS

TECHNICAL FIELD OF THE INVENTION

This invention relates generally to the field of semiconductor device burn-in and, more specifically, to a system and method for predicting burn-in conditions or stress conditions for semiconductor devices.

BACKGROUND OF THE INVENTION

Because of continual technological advancements in semiconductor manufacturing, geometries of semiconductor devices are shrinking. Thus, transistor density continues to grow. As process geometries shrink and leakage currents increase, a dramatic increase in device current at burn-in conditions (temperature and voltage) is seen. Burn-in conditions may cause extremely high IDDQ currents, which may create thermal and power issues and could potentially cause thermal runaway on strong material. Thermal runaway is a phenomenon where a device draws more current as it gets hotter, which results in more self-heating and may eventually lead to junction temperatures high enough to melt the package and possibly the test hardware.

New model burn-in ovens facilitate meeting an increased demand for current, but do little to combat the resulting thermal consequences. For example, the Aehr Max 4 ovens only provide temperature control on the oven level. Some expensive oven options allow for individual device temperature monitoring and regulation of fan control to prevent thermal runaway, except these ovens are expensive and do not facilitate optimal burn-in conditions. Consequently, common temperature set points must be found that will accommodate a wide range of potential device current needs.

SUMMARY OF THE INVENTION

According to one embodiment of the invention, a method for predicting burn-in conditions includes identifying a baseline IDDQ, a baseline temperature, and a baseline IDDQ current density based on a plurality of existing burn-in data for one or more existing devices, determining a theoretical IDDQ current density for a device, determining a ratio of the theoretical IDDQ current density to the baseline IDDQ current density, determining a theoretical process metric for the device at the baseline temperature based on the ratio and the baseline IDDQ, measuring a process metric for an actual device, comparing the process metric for the actual device and the theoretical process metric for the device, and determining an actual burn-in temperature for the actual device based on the comparison.

Some embodiments of the invention provide numerous technical advantages. Other embodiments may realize some, none, or all of these advantages. For example, in one embodiment, correct burn-in conditions for a new device may be ascertained without having to rely on experimental data. This may be especially important for application specific integrated circuits, in which the volume of devices manufactured is relatively small. Because process geometries are continually shrinking, having correct burn-in conditions potentially increases yield by eliminating the possibility of thermal runaway on strong material.

Other technical advantages are readily apparent to one skilled in the art from the following figures, descriptions, and claims.

BRIEF DESCRIPTION OF THE DRAWINGS

For a more complete understanding of the invention, and for further features and advantages, reference is now made to the following description, taken in conjunction with the accompanying drawings, in which.

DETAILED DESCRIPTION OF EXAMPLE EMBODIMENTS OF THE INVENTION

Figure 1:
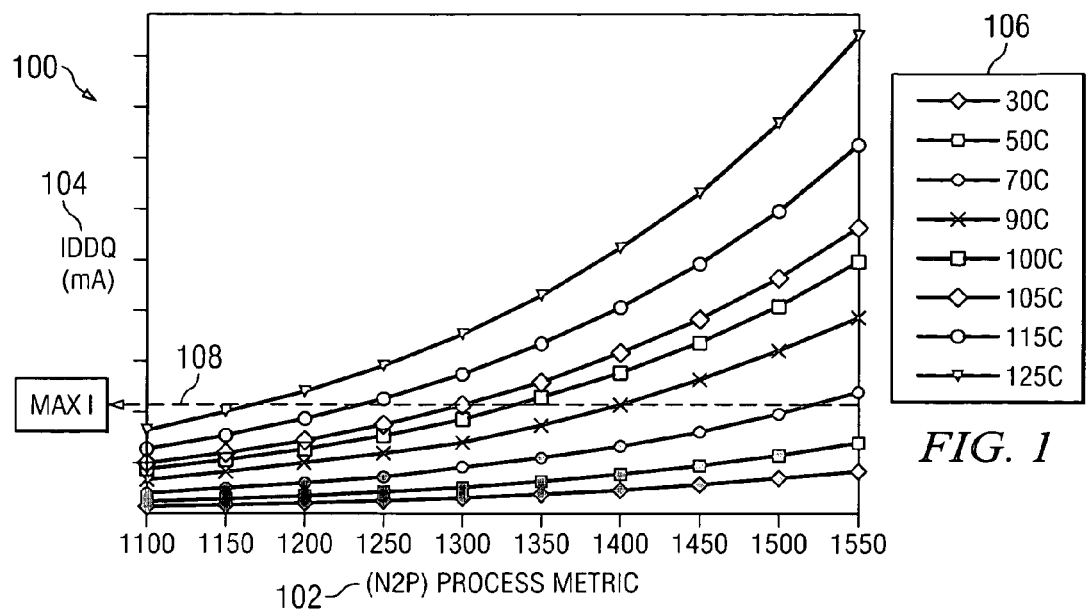
FIG. 1 is a graph illustrating the relationship between process metric and IDDQ at different burn-in temperatures for devices according to one embodiment of the present invention.
Figure 2:
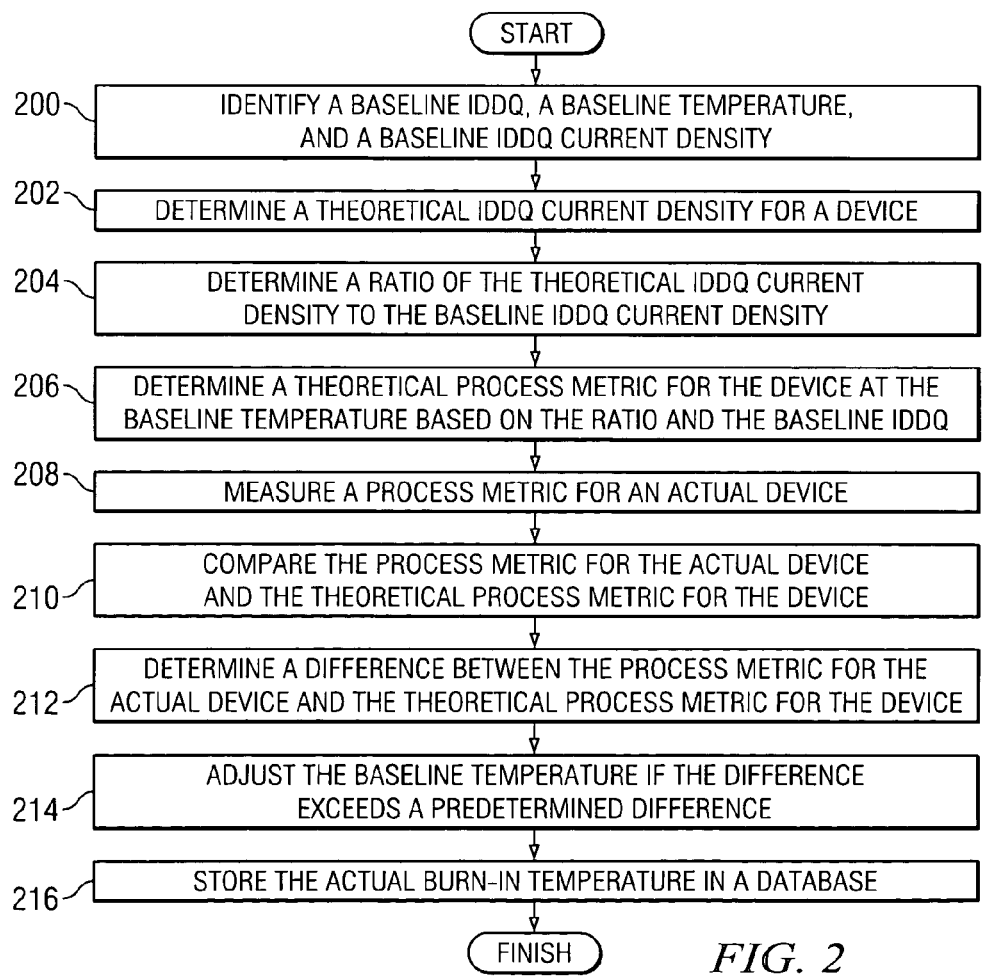
FIG. 2 is a flowchart illustrating a method for predicting burn-in conditions according to one embodiment of the present invention.

Example embodiments of the present invention and their advantages are best understood by referring now to FIGS. 1 and 2 of the drawings, in which like numerals refer to like parts.

FIG. 1 is a graph 100 illustrating the relationship between a process metric 102 and a quiescent current draw ("IDDQ") 104 at different burn-in temperatures 106 for semiconductor devices according to one embodiment of the present invention. The particular process metric illustrated in FIG. 1 is N2P. However, this process metric is used for example purposes only. The present invention contemplates any suitable process metric. As is well known in the semiconductor industry, the process metric may change from chip-to-chip depending on the design of the chip. IDDQ 104 is expressed in FIG. 1 as mA, but may be expressed in other suitable units. The IDDQ of a particular chip is the amount of current running through the chip in a quiescent state when there is no input signal applied thereto. Burn-in temperature 106 is illustrated in FIG. 1 as being expressed in degrees Celsius, but may be expressed in other suitable temperature units.

As illustrated in FIG. 1, IDDQ 104 rises exponentially with process metric 102. This exponential relationship becomes greater as burn-in temperature 106 increases. Because of continual technological advancements in semiconductor device manufacturing, geometries of semiconductor devices are shrinking. As process geometries shrink, leakage currents increase. Thus, a dramatic increase in device current at burn-in conditions is seen. Burn-in conditions may cause extremely high IDDQ currents, which may create thermal and power issues and could potentially cause thermal runaway. Thermal runaway is a phenomenon where a semiconductor device draws more current as it gets hotter, which results in more self-heating and may eventually lead to junction temperatures high enough to melt the package and possibly the test hardware. Thus, as illustrated by FIG. 1, a max IDDQ, as indicated by reference numeral 108, generally represents the maximum IDDQ that a particular semiconductor device can experience before potentially going into thermal runaway. Therefore, as process metric 102 of a particular device increases, the burn-in temperature 106 for that particular device needs to decrease to avoid thermal runaway or problem.

Therefore, according to the teachings of one embodiment of the present invention, a method is disclosed for predicting the correct burn-in temperature for a particular device for which there is no experimental burn-in data. An example embodiment of such a method is illustrated and described below in conjunction with the flowchart of FIG. 2. Although this detailed description discusses burn-in of semiconductor devices, any suitable stressing of semiconductor devices is contemplated by the present invention. Correctly ascertaining the burn-in temperature for a new semiconductor device without having to rely on experimental data may be advantageous, especially for relatively low volume parts such as application-specific integrated circuits ("ASICs"). Having the correct burn-in temperature for new semiconductor devices in which the process geometries are smaller than previous geometries potentially increases yield by eliminating the possibility of thermal runaway, especially in high leakage material.

FIG. 2 is a flowchart illustrating an example method for predicting burn-in conditions according to one embodiment of the invention. The example method begins at step 200 in which a plurality of baseline conditions are identified. In this illustrated embodiment, the baseline conditions identified are a baseline IDDQ, a baseline temperature, and a baseline IDDQ current density. Other suitable baseline conditions are contemplated by the present invention, such as a baseline process metric, a baseline voltage, and a baseline change in temperature per change in process metric. These baseline conditions are identified base on a plurality of existing burn-in data for one or more existing semiconductor devices. The greater number of devices, the better accuracy that may be obtained for the baseline conditions. Any suitable statistical analysis, such as a regression analysis, may be utilized to determine the baseline conditions.

For example, according to one embodiment of the invention, a plurality of process metrics, a plurality of burn-in temperatures, and a plurality of burn-in voltages for respective semiconductor devices are plotted on a graph. Then a regression analysis (or other statistical analysis) is utilized to express the baseline IDDQ as a function of a baseline process metric, a baseline burn-in temperature, and a baseline burn-in voltage. In a particular embodiment of the invention, the baseline IDDQ may be expressed as follows: baseline IDDQ=$10^{[w+x(V)+y(T)+z(N2P)]}$, where V=the baseline voltage; T=the baseline temperature; and N2P=the baseline process metric. The present invention contemplates the baseline IDDQ being expressed in other forms depending on the type of burn-in data utilized for the baseline conditions.

Based on existing ASICs, burn-in data for these devices were utilized to obtain the following specific baseline conditions. A baseline process metric of 1350, a baseline burn-in temperature of 105° C., a baseline IDDQ of 300 mA, a baseline IDDQ current density of 0.11, and a baseline change in temperature per change in process metric of 10° C. per one hundred process metric. Again, other suitable baseline conditions may be utilized within the teachings of the present invention. For example, depending on the type of risk that is willing to be taken, the change in burn-in temperature per change in process metric may be anywhere from 10–15° C. The baseline voltage utilized in this example embodiment is 1.7 volts; however, other suitable baseline voltages may also be utilized.

After the baseline conditions are identified, a burn-in temperature for a new semiconductor device or a semiconductor device that has not been burned-in before may be determined by the following steps. At step 202, a theoretical IDDQ current density for a particular device is determined. This may be based on design information for that device and may be estimated using any suitable estimation tools. A ratio of the theoretical IDDQ current density to the baseline IDDQ current density is determined at step 204. Based on this ratio and the IDDQ equation identified above in the baseline conditions, a theoretical process metric for the device at the baseline temperature is determined, as indicated by step 206. Referring to the equation as indicated above as an example, the baseline voltage, baseline temperature, and baseline IDDQ are known and because of the ratio it is known whether or not to reduce or increase the baseline IDDQ based on the ratio of the theoretical and baseline current densities, as determined at step 204. The only unknown is the theoretical process metric. The equation may then be solved to determine the theoretical process metric for the device. Thus, the process metric and burn-in temperature for the particular device is theoretically known.

Finally, to determine the correct burn-in temperature for an actual device, a process metric for an actual device is measured at step 208. This measuring may be done with varying levels of granularity. For example, the measuring may include averaging a plurality of process metrics for respective actual devices formed on a single wafer or a plurality of wafers of a particular lot. Other suitable measurements may also be utilized, such as measuring specific zones of a wafer, or taking the maximum process metric of a particular wafer or wafer lot.

A difference between the process metric of the actual device and the theoretical process metric for the device that was determined in step 206 is determined at step 212. The baseline temperature is adjusted to an actual burn-in temperature if the difference exceeds a predetermined difference, as indicated by step 214. Thus, the correct burn-in temperature may be identified for the actual device based on the theoretical process metric and baseline burn-in temperature. For example, as indicated above, a change in burn-in temperature per change in process metric may be found to be approximately 10° C. per a change of one hundred process metric. If the process metric for the actual device was found to be 1250 and the theoretical process metric for the device was determined to be 1350, then the burn-in temperature may be increased by 10° C. from 105° C. to 115° C. Conversely, if the process metric for the actual device was one hundred more than the theoretical process metric, then the burn-in temperature may be reduced by 10° C. to 95° C. The actual burn-in temperatures for particular devices may then be stored in a database, as indicated by 216, so that burn-in personnel can easily retrieve the burn-in temperature for a particular device, wafer, or lot of wafers with the assurance that problems such as thermal runaway will not occur during burn-in.

Although embodiments of the invention and their advantages are described in detail, a person skilled in the art could make various alterations, additions, and omissions without departing from the spirit and scope of the present invention, as defined by the appended claims.

What is claimed is:

1. A method for predicting burn-in conditions, comprising:

identifying a baseline IDDQ, a baseline temperature, and a baseline IDDQ current density based on a plurality of existing burn-in data for one or more existing devices;

determining a theoretical IDDQ current density for a device;

determining a ratio of the theoretical IDDQ current density to the baseline IDDQ current density;

determining a theoretical process metric for the device at the baseline temperature based on the ratio and the baseline IDDQ;

measuring a process metric for an actual device;

comparing the process metric for the actual device and the theoretical process metric for the device; and determining an actual burn-in temperature for the actual device based on the comparison.

2. The method of claim 1, further comprising storing the actual burn-in temperature in a database.

3. The method of claim 1, wherein identifying the baseline IDDQ based on the plurality of existing burn-in data for one or more existing devices comprises:
- plotting a process metric for each device;
- plotting a burn-in temperature for each device;
- plotting a burn-in voltage for each device; and
- utilizing regression analysis to express the baseline IDDQ as a function of a baseline process metric, a baseline burn-in temperature, and a baseline burn-in voltage.

4. The method of claim 3, wherein the baseline IDDQ is expressed as baseline $IDDQ=10^{[w+x(V)+y(T)+z(N2P)]}$
where V=a baseline voltage; T=the baseline temperature; and N2P=a baseline process metric.

5. The method of claim 1, wherein measuring the process metric for the actual device comprises averaging a plurality of process metrics for respective actual devices formed on a single wafer.

6. The method of claim 1, wherein measuring the process metric for the actual device comprises averaging a plurality of process metrics for respective actual devices formed on a plurality of wafers of a lot.

7. The method of claim 1, wherein determining the actual burn-in temperature for the actual device based on the comparison comprises:
- determining a difference between the process metric for the actual device and the theoretical process metric for the device; and
- adjusting the baseline temperature if the difference exceeds a predetermined difference.

8. The method of claim 7, wherein the predetermined difference is a process metric of one hundred.

9. The method of claim 7, wherein adjusting the baseline temperature comprises adjusting the baseline temperature between ten and fifteen degrees Celsius.

10. A method for predicting burn-in conditions, comprising:
- identifying a plurality of baseline conditions based on a plurality of existing burn-in data for one or more existing devices, comprising:
  - determining a baseline process metric;
  - determining a baseline burn-in temperature;
  - determining a baseline burn-in voltage;
  - determining a baseline IDDQ expressed as a function of the baseline process metric, the baseline burn-in temperature, and the baseline burn-in voltage; and
  - determining a baseline IDDQ current density;
- determining a theoretical IDDQ, a theoretical area, and a theoretical IDDQ current density for a device;
- determining a ratio of the theoretical IDDQ current density to the baseline IDDQ current density;
- determining a theoretical process metric for the device at the baseline temperature based on the ratio and the baseline IDDQ;
- measuring a process metric for an actual device;
- determining a difference between the process metric for the actual device and the theoretical process metric for the device; and
- adjusting the baseline temperature if the difference exceeds a predetermined difference.

11. The method of claim 10, further comprising storing the actual burn-in temperature in a database.

12. The method of claim 10, wherein identifying the baseline IDDQ based on the plurality of existing burn-in data for one or more existing devices comprises:
- plotting a process metric for each device;
- plotting a burn-in temperature for each device;
- plotting a burn-in voltage for each device; and
- utilizing regression analysis to express the baseline IDDQ as a function of a baseline process metric, a baseline burn-in temperature, and a baseline burn-in voltage.

13. The method of claim 11, wherein the baseline IDDQ is expressed as baseline $IDDQ=10^{[w+x(V)+y(T)+z(N2P)]}$
where V=a baseline voltage; T=the baseline temperature; and N2P=a baseline process metric.

14. The method of claim 10, wherein measuring the process metric for the actual device comprises averaging a plurality of process metrics for respective actual devices formed on a single wafer.

15. The method of claim 10, wherein measuring the process metric for the actual device comprises averaging a plurality of process metrics for respective actual devices formed on a plurality of wafers of a lot.

16. The method of claim 10, wherein the predetermined difference is a process metric of one hundred.

17. The method of claim 10, wherein adjusting the baseline temperature comprises adjusting the baseline temperature between ten and fifteen degrees Celsius.

18. A method for predicting burn-in conditions, comprising:
- receiving existing burn-in data for a plurality of existing devices;
- plotting respective process metrics for the exiting devices;
- plotting respective burn-in temperatures for the existing devices;
- plotting respective burn-in voltages for the existing devices;
- utilizing statistical analysis to express a baseline IDDQ as a function of a baseline process metric, a baseline burn-in temperature, and a baseline burn-in voltage based on the respective process metrics, the respective burn-in temperatures, and the respective burn-in voltages;
- identifying a baseline IDDQ current density from the existing burn-in data;
- determining a theoretical IDDQ current density for a device;
- determining a ratio of the theoretical IDDQ current density to the baseline IDDQ current density;
- determining a theoretical process metric for the device at the baseline temperature based on the ratio and the baseline IDDQ;
- measuring a process metric for an actual device;
- determining a difference between the process metric for the actual device and the theoretical process metric for the device; and
- adjusting the baseline temperature between ten and fifteen degrees Celsius if the difference exceeds approximately one hundred.

19. The method of claim 18, wherein the baseline process metric is between 1250 and 1450 and the baseline burn-in temperature is between 95° C. and 115° C.

20. The method of claim 18, wherein the baseline IDDQ current density is between 0.05 and 0.15.

* * * * *